(12) United States Patent
Parteder et al.

(10) Patent No.: US 10,243,017 B2
(45) Date of Patent: Mar. 26, 2019

(54) SENSOR CHIP STACK AND METHOD OF PRODUCING A SENSOR CHIP STACK

(71) Applicant: ams International AG, Rapperswil (CH)

(72) Inventors: Georg Parteder, Gleisdorf (AT); Jochen Kraft, Bruck an der Mur (AT); Franz Schrank, Graz (AT); Thomas Troxler, Erlenbach (CH); Andreas Fitzi, Staefa (CH)

(73) Assignee: ams International AG, Rapperswil (CH)

(*) Notice: Subject to any disclaimer, the term of this patent is extended or adjusted under 35 U.S.C. 154(b) by 0 days.

(21) Appl. No.: 15/636,545

(22) Filed: Jun. 28, 2017

(65) Prior Publication Data

US 2018/0006074 A1 Jan. 4, 2018

(30) Foreign Application Priority Data

Jul. 4, 2016 (EP) .................................. 16177777

(51) Int. Cl.
*H01L 27/146* (2006.01)
*H01L 25/065* (2006.01)
(Continued)

(52) U.S. Cl.
CPC .... *H01L 27/14636* (2013.01); *H01L 25/0657* (2013.01); *H01L 27/1469* (2013.01);
(Continued)

(58) Field of Classification Search
CPC .......... H01L 27/146–27/148; H01L 27/14634; H01L 27/14636; H01L 27/1464;
(Continued)

(56) References Cited

U.S. PATENT DOCUMENTS 8,653,641 B2 * 2/2014 Chen ....................... H01L 23/60
257/686
9,287,140 B2 3/2016 Chung et al.
(Continued)

FOREIGN PATENT DOCUMENTS

CN 101055866 A 10/2007
CN 101207113 A 6/2008
(Continued)

OTHER PUBLICATIONS

Schrank, F. et al., "Manufacturing of 3D-integrated Optoelectronic and Photonic ICs and Systems", 45th European Solid State Device Research Conference, Sep. 14-18, 2015, Graz, Austria.
(Continued)

*Primary Examiner* — Marvin Payen
*Assistant Examiner* — Jeremy Joy
(74) *Attorney, Agent, or Firm* — Fish & Richardson P.C.

(57) ABSTRACT

The sensor chip stack comprises a sensor substrate of a semiconductor material including a sensor, a chip fastened to the sensor substrate, the chip including an integrated circuit, electric interconnections between the sensor substrate and the chip, electric terminals of the chip, the chip being arranged between the electric terminals and the sensor substrate, and a molding material arranged adjacent to the chip, the electric terminals of the chip being free from the molding material.

5 Claims, 3 Drawing Sheets

(51) Int. Cl.
*H04N 5/225* (2006.01)
*H04N 5/369* (2011.01)

(52) U.S. Cl.
CPC .. *H01L 27/14618* (2013.01); *H01L 27/14623* (2013.01); *H01L 27/14634* (2013.01); *H04N 5/369* (2013.01); *H04N 5/2258* (2013.01)

(58) Field of Classification Search
CPC .......... H01L 27/14643; H01L 27/1469; H01L 27/14618; H01L 27/14623; H01L 25/0657; H01L 2224/0557
See application file for complete search history.

(56) References Cited

U.S. PATENT DOCUMENTS

| | | | | |
|---|---|---|---|---|
| 2005/0275752 | A1* | 12/2005 | Li | H04N 7/17318 348/398.1 |
| 2008/0136002 | A1* | 6/2008 | Yang | H01L 24/82 257/686 |
| 2008/0142990 | A1* | 6/2008 | Yu | H01L 21/8221 257/777 |
| 2008/0211045 | A1* | 9/2008 | Ono | H01L 27/14618 257/432 |
| 2008/0308928 | A1* | 12/2008 | Chang | H01L 25/0657 257/723 |
| 2010/0193893 | A1* | 8/2010 | Meinhardt | H01L 27/14634 257/461 |
| 2012/0194719 | A1* | 8/2012 | Churchwell | H01L 23/5389 348/302 |
| 2012/0313209 | A1* | 12/2012 | Oganesian | H01L 27/14618 257/443 |
| 2013/0020665 | A1* | 1/2013 | Oganesian | H01L 27/14618 257/432 |
| 2013/0285180 | A1* | 10/2013 | Wang | H01L 27/14618 257/432 |
| 2014/0035083 | A1* | 2/2014 | Wan | H01L 27/14634 257/432 |
| 2014/0263959 | A1* | 9/2014 | Hsu | H01L 31/18 250/208.1 |
| 2015/0060968 | A1* | 3/2015 | Sa | H01L 27/14609 257/292 |
| 2016/0020239 | A1* | 1/2016 | Liu | H01L 27/14634 257/292 |
| 2017/0221952 | A1* | 8/2017 | Huang | H01L 27/14636 |

FOREIGN PATENT DOCUMENTS

| | | | | |
|---|---|---|---|---|
| CN | 102820274 | A | 12/2012 | |
| CN | 103378109 | A | 10/2013 | |
| EP | 2731129 | A1 | 5/2014 | |
| JP | 2008130603 | A * | 6/2008 | ....... H01L 27/14618 |
| JP | 2008130603 | A | 6/2008 | |
| TW | 200849982 | A | 12/2008 | |
| WO | WO-2016094136 | A1 | 6/2016 | |

OTHER PUBLICATIONS

Takahashi, Y. et al., "Over Molding Process Development for a Stacked Wafer-level Chip Scale Package with Through Silicon Vias (TSVs)", Transactions of the Japan Institute of Electronics Packaging vol. 5, No. 1, 122-131 (2012).

\* cited by examiner

SENSOR CHIP STACK AND METHOD OF PRODUCING A SENSOR CHIP STACK

BACKGROUND OF THE INVENTION

Semiconductor chips with integrated circuits can be stacked, and terminals of the integrated circuits can be electrically connected. Through-silicon vias (TSVs) provide electric connections penetrating a silicon substrate of a chip.

U.S. Pat. No. 9,287,140 B2 discloses semiconductor packages. A plurality of semiconductor chips are stacked on a further semiconductor chip and bonded in a flip-chip manner to form a chip-on-wafer structure. The chips comprise a semiconductor substrate, integrated memory and logic circuits and through electrodes. A mold layer is formed to cover the chips and to provide rigidity to the further chip. The substrate of the further chip is thinned from its rear surface.

Y. Takahashi et al., "Over Molding Process Development for a Stacked Wafer-level Chip Scale Package with Through Silicon Vias (TSVs)", Transactions of The Japan Institute of Electronics Packaging 5, 122-131 (2012) describe a package wherein a top die with micro-bumps is attached directly to the exposed TSV tips of a thin wafer-level chip scale package. Different under-fill properties, mold compound properties and mold techniques are evaluated.

F. Schrank et al., "Manufacturing of 3D-integrated Optoelectronic and Photonic ICs and Systems", 45th European Solid State Device Research Conference 2015, describe sensor integration options including 3D integration concepts.

SUMMARY OF THE INVENTION

The sensor chip stack allows to arrange chips adjacent to one another on four lateral sides. The detector part, which may comprise photodiodes or active pixels, for instance, is separate from the control, readout and analogue-to-digital conversion circuits, which are integrated in semiconductor chips and arranged on the detector part as a chip stack.

The sensor chip stack comprises a sensor substrate of a semiconductor material including a sensor, in particular a plurality of sensors, a chip, which includes an integrated circuit and is fastened to the sensor substrate, electric interconnections between the sensor substrate and the chip, electric terminals of the chip, the chip being arranged between the electric terminals and the sensor substrate, and a molding material arranged adjacent to the chip. Electric terminals of the chip are free from the molding material.

Embodiments of the sensor chip stack further comprise bond pads of the sensor substrate and contact pads of the chip, the contact pads facing the bond pads. The electric interconnections comprise pad connections, which may especially be via bumps. Each of the pad connections electrically connects one of the bond pads and one of the contact pads.

In further embodiments a contact layer of the chip is arranged between the sensor substrate and the chip. A through-chip metallization penetrates the chip, contacts the contact layer and is electrically connected to one of the electric terminals of the chip.

In further embodiments a contact pad of the sensor substrate is arranged between the sensor substrate and the chip. The electric interconnections comprise a sidewall metallization penetrating the molding material. The sidewall metallization contacts the contact pad and is electrically connected to one of the electric terminals of the chip.

In further embodiments a further chip is fastened to the sensor substrate, the further chip including a further integrated circuit and comprising further electric terminals. The further chip is arranged between the further electric terminals and the sensor substrate. The molding material is arranged adjacent to the further chip, and the further electric terminals are free from the molding material.

Further embodiments comprise further contact pads of the further chip, the further contact pads facing the bond pads. The electric interconnections comprise further pad connections, each of the further pad connections electrically connecting one of the bond pads and one of the further contact pads.

Further embodiments comprise a contact pad of the sensor substrate. The electric interconnections comprise a sidewall metallization penetrating the molding material between the chip and the further chip and contacting the contact pad.

Further embodiments comprise an underfill material between the sensor substrate and the chip.

The method of producing a sensor chip stack comprises providing a sensor substrate including a plurality of sensors, providing a plurality of chips including an integrated circuit and contact pads, fastening the chips to the sensor substrate and forming electric interconnections between the sensor substrate and the chips, forming electric terminals of the chips, the chips being arranged between the electric terminals and the sensor substrate, and filling interspaces between the chips with a molding material without covering the electric terminals.

In a variant of the method the integrated circuits are arranged next to the sensor substrate.

In a further variant of the method, the integrated circuits are arranged remote from the sensor substrate.

A further variant of the method comprises providing the sensor substrate with bond pads, providing the chips with contact pads, and forming pad connections, each of the pad connections electrically connecting one of the bond pads and one of the contact pads.

A further variant of the method comprises providing the sensor substrate with contact pads and forming sidewall metallizations penetrating the molding material between the chips, each sidewall metallization contacting one of the contact pads.

The following is a more detailed description of examples of the sensor chip stack and the method of producing a sensor chip stack in conjunction with the appended figures.

DETAILED DESCRIPTION

Figure 1:
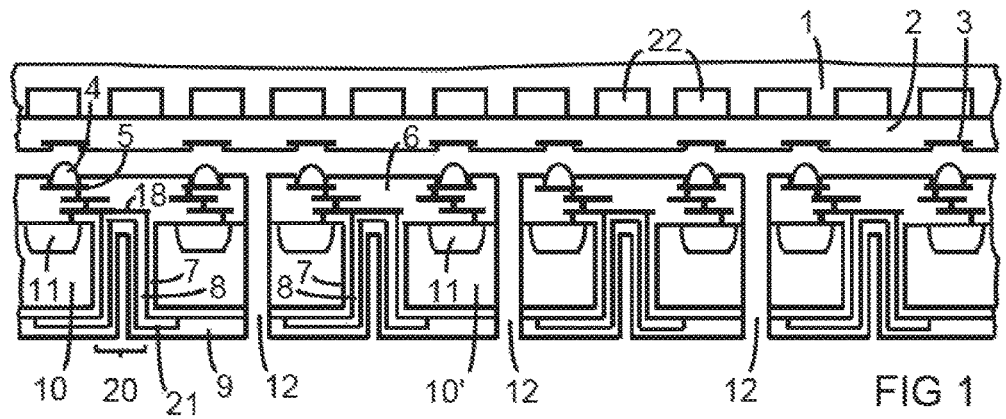
FIG. 1 is a cross section of a sensor substrate and chips.

FIG. 1 is a cross section of a sensor substrate 1 and chips 10, which are to be arranged on the sensor substrate 1. The sensor substrate 1 comprises sensor components like photodiodes, for instance, which are schematically indicated in FIG. 1 as photodiode implants 22. The sensors may comprise any conventional sensor components suitable for semiconductor devices, and hence the structure of the sensors is not restricted to special embodiments. A dielectric layer 2 is applied on the sensor substrate 1, and bond pads 3 are arranged in the dielectric layer 2, which is recessed above the bond pads 3.

The chips 10 are provided with components of integrated circuits 11 formed in semiconductor material. The integrated circuits 11 may comprise any conventional circuit components suitable for semiconductor devices, like CMOS components, for instance, and are therefore only schematically represented in the figures. Contact pads 5 of the chips 10 are arranged opposite the bond pads 3 of the sensor substrate 1. Pad connections 4 are formed between the bond pads 3 and the contact pads 5 of the chips. The pad connections 4 may comprise solder balls or bump contacts, for instance, which can be arranged on the bond pads 3 or on the contact pads 5. The contact pads 5 may be formed in an upper metallization layer of a wiring embedded in a dielectric layer 6 of the chips 10. The wiring can be provided for the integrated circuits 11.

In the embodiment shown in FIG. 1, the integrated circuits 11 are arranged next to the sensor substrate 1. The integrated circuits 11 may instead be arranged remote from the sensor substrate 1. The chips 10 may be arranged on the sensor substrate 1 in such a manner that only small interspaces 12 are left between adjacent chips 10.

FIG. 1 shows how the chips 10 may be provided with through-chip vias 20 as further electric interconnections. Each through-chip via 20 comprises an insulating layer 7 between a through-chip metallization 8 and the semiconductor material of the chip 10. The through-chip metallization 8 contacts a contact layer 18 in the dielectric layer 6 of the chip 10 and is electrically connected to an electric conductor like a redistribution layer 21, for instance, arranged on the rear side of the chip 10.

There may be any suitable number of through-substrate vias 20 in the chips 10. The contact layer 18 may be part of the wiring. The contact layer 18 may be connected to the integrated circuit 11 and/or to the contact pad 5, as indicated in FIG. 1 by way of example. The electric connections can be different and may be adapted to the requirements of individual embodiments according to the desired application. A passivation layer 9 may be applied on the rear side of the chips 10.

Figure 2:
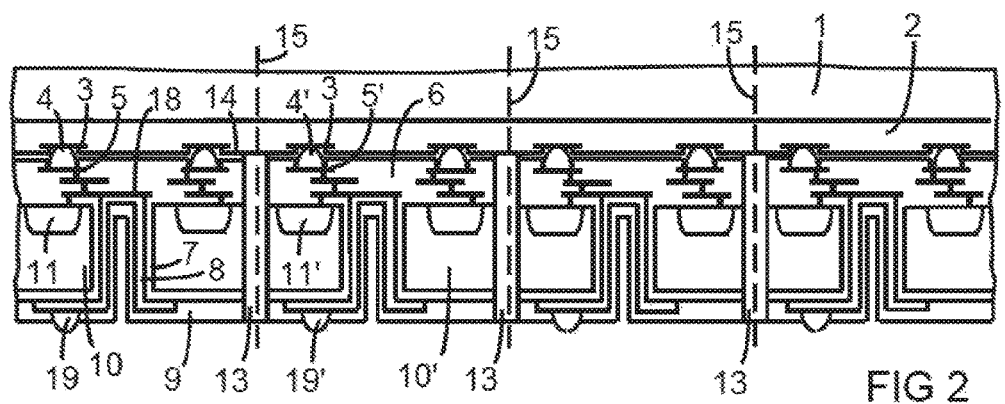
FIG. 2 is a cross section of a sensor chip stack.

FIG. 2 is a cross section of a sensor chip stack, which is obtained from the arrangement shown in FIG. 1 after the chips 10 are mounted on the sensor substrate 1. The pad connections 4 electrically connect the bond pads 3 and the contact pads 5 and form a permanent bond between the sensor substrate 1 and the chips 10. Electric terminals 19 may be arranged on the rear conductors for external electric connections. A gap remaining between the sensor substrate 1 and the chips 10 may be filled with an underfill material 14, which may be an epoxy resin or a silicone, for instance.

FIG. 2 shows the arrangement of a chip 10 and an adjacent further chip 10', which comprises further pad connections 4', further contact pads 5', a further integrated circuit 1 and further electric terminals 19'. The interspace between the chip 10 and the further chip 10' is filled with a molding material 13, which does not cover the electric terminals 19 and further electric terminals 19'. This arrangement allows to mount the sensor chip stack on a carrier like a printed circuit board by means of the electric terminals 19, which may especially be solder balls, bump contacts or the like.

The molding material 13 may be an epoxy resin or a silicone, for instance. It may be the same material as the underfill material 14, or it may be different from the underfill material 14. The molding material 13 and the underfill material 14 may be modified by additives to minimize stress occurring in the sensor chip stack. In particular, the coefficient of thermal expansion of the underfill material 14 may be adapted to the material of the pad connections 4, while the coefficient of thermal expansion of the molding material 13 may be adapted to the sensor substrate 1.

In FIG. 2 dicing planes 15 are indicated by vertical broken lines. Individual sensor chip stacks can be separated along the dicing planes 15. The diced sensor chip stacks may each comprise only one chip 10, or more than one chip 10 may instead be provided for each sensor chip stack, according to the requirements of the desired applications.

Figure 3:
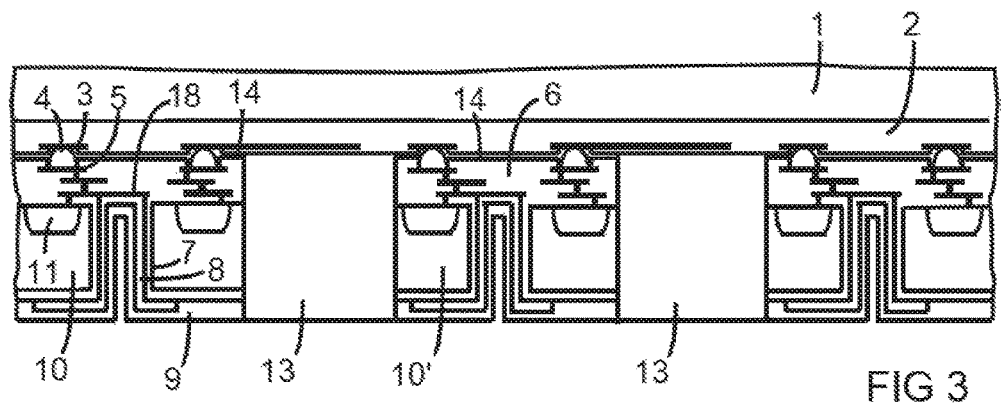
FIG. 3 is a cross section of a further sensor chip stack.

FIG. 3 is a cross section of a further sensor chip stack, in which the distance between adjacent chips 10, 10' is larger than in the embodiment according to FIG. 2. Elements of the embodiment according to FIG. 3 that are similar to corresponding elements of the embodiment according to FIG. 2 are designated with the same reference numerals.

Figure 4:
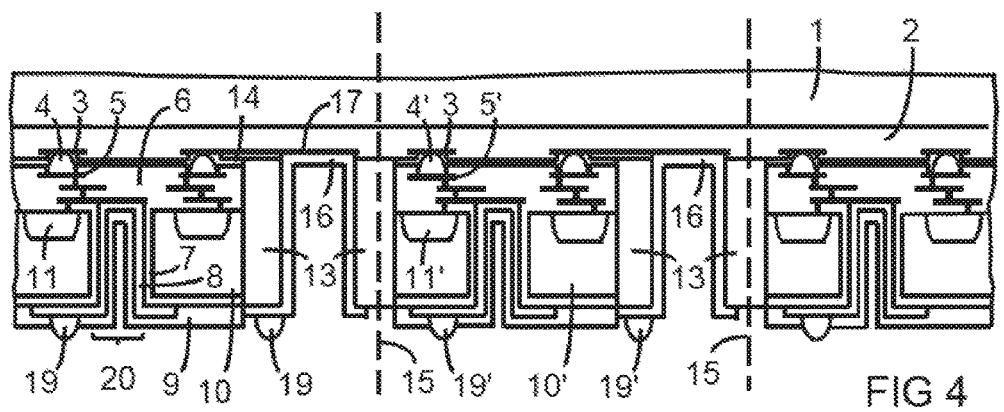
FIG. 4 is a cross section according to FIG. 3 after the formation of electric interconnections.

FIG. 4 is a cross section according to FIG. 3 after the formation of further electric interconnections. Openings are formed in the molding material 13 between adjacent chips 10, 10'. A sidewall metallization 16 is applied inside each of the openings. The sidewall metallizations 16 electrically contact the surface of contact pads 17 formed on the sensor substrate 1. Thus electric interconnections are formed between the sensor substrate 1, in particular the bond pads 3 of the sensor substrate 1, for example, and electric conductors, in particular electric terminals 19, arranged on the rear sides of the chips 10, 10'.

In FIG. 4 dicing planes 15 are indicated by vertical broken lines. Individual sensor chip stacks can be separated along the dicing planes 15. The diced sensor chip stacks may each comprise only one chip 10, or more than one chip 10 may instead be provided for each sensor chip stack.

Figure 5:
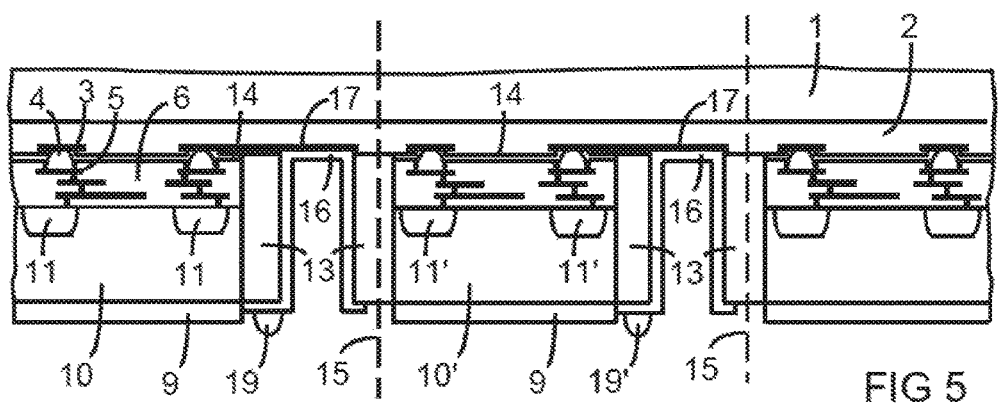
FIG. 5 is a cross section according to FIG. 4 of a further sensor chip stack.

FIG. 5 is a cross section according to FIG. 4 of a further sensor chip stack, which is not provided with through-chip vias in the chips 10. Elements of the embodiment according to FIG. 5 that are similar to corresponding elements of the embodiment according to FIG. 4 are designated with the same reference numerals.

Figure 6:
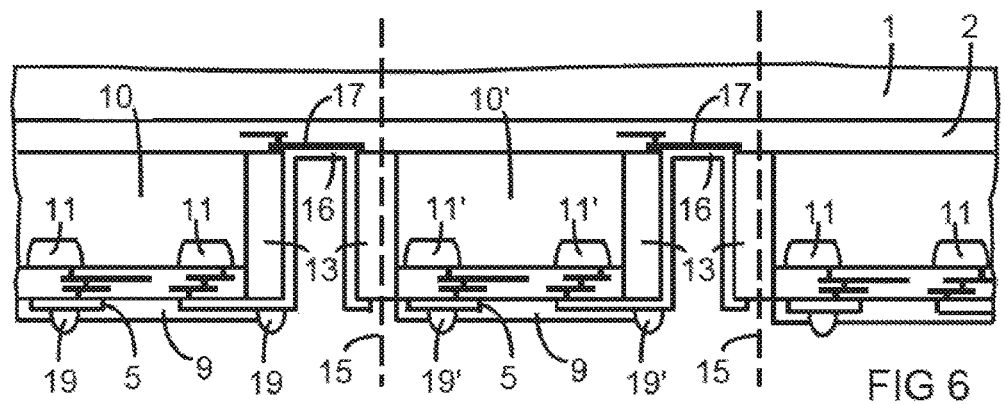
FIG. 6 is a cross section according to FIG. 5 for a different arrangement of the chips.

FIG. 6 is a cross section according to FIG. 5 for a different arrangement of the chips 10. Elements of the embodiment according to FIG. 6 that are similar to corresponding elements of the embodiment according to FIG. 5 are designated with the same reference numerals. In the embodiment according to FIG. 6, the chips 10 are arranged so that the integrated circuits 11 are remote from the sensor substrate 1. The electric interconnections between the sensor substrate 1 and the electric terminals 19 and/or terminals of the integrated circuits 11 are formed by the sidewall metallizations 16 that are arranged in the molding material 13 between adjacent chips 10, 10' and on contact pads 17 of the sensor substrate 1.

Figure 7:
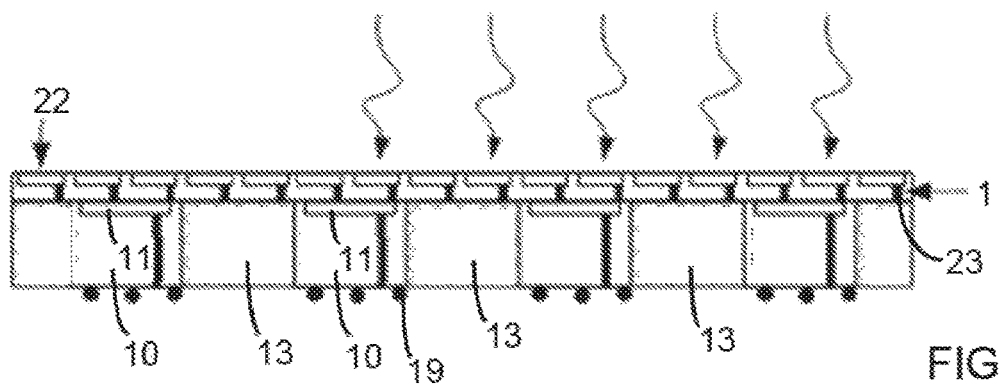
FIG. 7 is a cross section of a sensor chip stack with an arrangement of sensors and through-substrate vias.

FIG. 7 is a cross section of a sensor chip stack showing an arrangement of sensors in the sensor substrate 1. In the embodiment according to FIG. 7, photodiode implants 22, which are provided for the sensors, are arranged on the side of the sensor substrate 1 that is remote from the chips 10 and the molding material 13. The integrated circuits 11 are arranged next to the sensor substrate 1. Through-substrate vias 23 connect the photodiode implants 22 with the integrated circuits 11.

Figure 8:
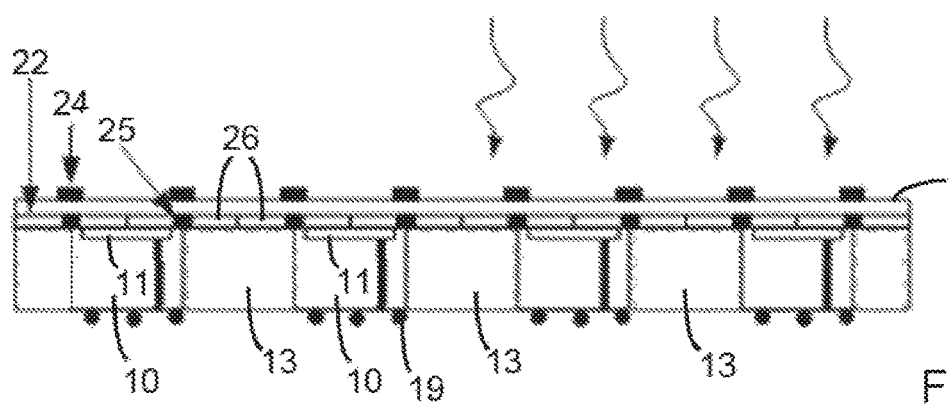
FIG. 8 is a cross section according to FIG. 7 for a further arrangement of the sensors.

FIG. 8 is a cross section according to FIG. 7 for a further arrangement of the sensors. In the embodiment according to FIG. 8, photodiode implants 22, which are provided for the sensors, are arranged on the side of the sensor substrate 1 that faces the chips 10 and the molding material 13, as schematically indicated also in FIG. 1. Light shields 24 may be provided between pixels 26 that are formed by the array of sensors. The pixels 26 may be active pixels provided with active components like transistors 25. More than one individual sensor may be provided for each pixel 26.

Figure 9:
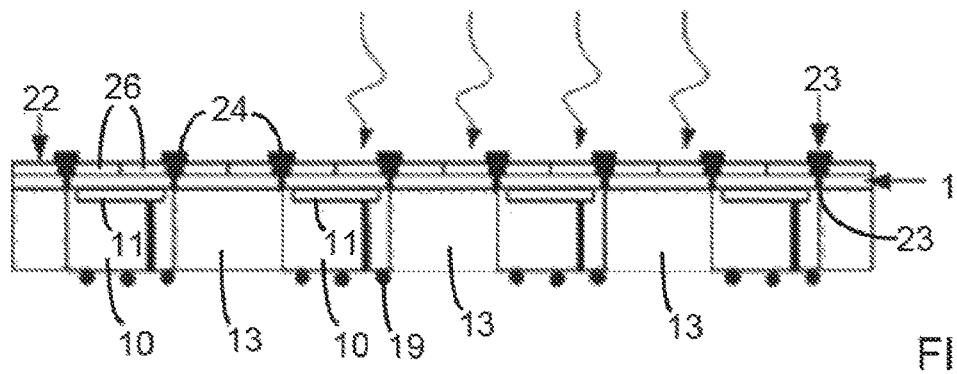
FIG. 9 is a cross section according to FIG. 8 for a further arrangement of the sensors and through-substrate vias.

FIG. 9 is a cross section according to FIG. 8 for a further arrangement of the sensors including through-substrate vias 23. In the embodiment according to FIG. 9, photodiode implants 22, which are provided for the sensors, are arranged on the side of the sensor substrate 1 that is remote from the chips 10 and the molding material 13. The integrated circuits 11 are arranged next to the sensor substrate 1. Through-substrate vias 23 connect the photodiode implants 22 with the integrated circuits 11. Light shields 24 are optionally provided between the pixels 26, which comprise more than one individual sensor in this embodiment.

In the embodiments according to FIGS. 7 to 9, the chips 10 can instead be arranged with the integrated circuits 11 on the rear side, facing away from the sensor substrate 1, as in the embodiment according to FIG. 6.

The sensor chip stack may comprise small, large or very large sensor substrates 1 (the diagonal size may be close to the diameter of a semiconductor wafer) containing several photodiodes or active pixel arrays, optionally including shift registers for the addressing of the pixels. The shift registers allow to read the pixels in a series connection, which may be favorable for a tight arrangement of the chips 10. The chips 10 may be small in comparison with conventional sensor devices that are intended for large detection areas. The chips 10 may contain the control and readout circuits, analogue-to-digital conversion and a digital interface or any other circuit. The sensor substrate 1 and the chips 10 can be produced separately in standard process flows. Only functional chips are selected to be arranged on the sensor substrate 1 by a die-to-wafer stacking process known per se.

Gaps between the chips and the sensor substrate can be filled with molding material on wafer level, which guarantees sufficient mechanical stability of the stack. An underfill material 14 is applied to fill the gaps between the sensor substrate 1 and the chips 10. The molding material 13 filling the interspaces 12 between the chips 10 can subsequently be applied in a further method step. As the molding material 13 provides sufficient mechanical stability, the sensor substrate 1 can be thinned to its final thickness, which may amount to a few micrometers. The electric terminals 19, which may be bump contacts, for instance, can be applied to the rear sides of the chips 10 on wafer level. Finally, the sensor substrate 1 with stacked chips 10 is diced according to the scribe line scheme of the sensor array. The structure of the molding material 13 allows the individual sensor chip stacks to be mounted and electrically connected at the rear side of the chips 10, i. e. on the side facing away from the sensor substrate 1.

The invention claimed is:

1. A sensor chip stack, comprising:
   a sensor substrate of a semiconductor material including a sensor or plurality of sensors;
   bond pads of the sensor substrate;
   a chip fastened to the sensor substrate, the chip including an integrated circuit;
   contact pads of the chip, the contact pads facing the bond pads;
   pad connections including via bumps between the sensor substrate and the chip, each of the pad connections electrically connecting one of the bond pads and one of the contact pads;
   electric terminals of the chip, the chip being arranged between the electric terminals and the sensor substrate;
   a molding material arranged adjacent to the chip, the electric terminals of the chip being free from the molding material;
   a sidewall metallization inside an opening of the molding material, the sidewall metallization electrically connecting one of the electric terminals of the chip with a contact pad of the sensor substrate;
   a contact layer of the chip, the contact layer being arranged between the sensor substrate and the chip; and
   a through-chip metallization penetrating the chip, the through-chip metallization contacting the contact layer and being electrically connected to one of the electric terminals.

2. The sensor chip stack according to claim 1, further comprising:
   a further chip fastened to the sensor substrate, the further chip including a further integrated circuit;
   further electric terminals of the further chip, the further chip being arranged between the further electric terminals and the sensor substrate; and
   the molding material being arranged adjacent to the further chip, the further electric terminals being free from the molding material.

3. The sensor chip stack according to claim 1, further comprising:
   a further chip fastened to the sensor substrate, the further chip including a further integrated circuit;
   further electric terminals of the further chip, the further chip being arranged between the further electric terminals and the sensor substrate;
   further contact pads of the further chip, the further contact pads facing the bond pads;
   the electric interconnections comprising further pad connections, each of the further pad connections electrically connecting one of the bond pads and one of the further contact pads; and
   the molding material being arranged adjacent to the further chip, the further electric terminals being free from the molding material.

4. The sensor chip stack according to claim 2 or 3, wherein the sidewall metallization penetrates the molding material between the chip and the further chip and contacting the contact pad.

5. The sensor chip stack according to claim 1, further comprising:
   an underfill material between the sensor substrate and the chip.

* * * * *